(12) United States Patent
Hsu

(10) Patent No.: US 7,439,440 B2
(45) Date of Patent: Oct. 21, 2008

(54) AUDIO PLAYER USING SIGMA-DELTA PULSE-WIDTH MODULATION

(75) Inventor: Han-Huah Hsu, Hsin Chu (TW)

(73) Assignee: Sunplus Technology Co. Ltd., Hsin-Chu (TW)

(*) Notice: Subject to any disclaimer, the term of this patent is extended or adjusted under 35 U.S.C. 154(b) by 285 days.

(21) Appl. No.: 11/236,544

(22) Filed: Sep. 28, 2005

(65) Prior Publication Data

US 2006/0077084 A1 Apr. 13, 2006

(30) Foreign Application Priority Data

Oct. 11, 2004 (TW) .............................. 93130781 A (51) Int. Cl.
*G10H 1/00* (2006.01)
*H03F 3/38* (2006.01)
(52) U.S. Cl. ..................... 84/600; 330/10; 341/143
(58) Field of Classification Search ................ None
See application file for complete search history.

(56) References Cited

U.S. PATENT DOCUMENTS

| 6,795,004 | B2 * | 9/2004 | Masuda et al. ............... 341/143 |
| 6,822,594 | B1 * | 11/2004 | Melanson et al. ............ 341/143 |
| 7,020,219 | B2 * | 3/2006 | Panasik et al. ............... 375/324 |
| 7,142,144 | B1 * | 11/2006 | Farooqi et al. .............. 341/143 |
| 7,259,618 | B2 * | 8/2007 | Hand et al. .................... 330/10 |
| 2005/0058209 | A1 * | 3/2005 | Magrath ...................... 375/247 |
| 2005/0068212 | A1 * | 3/2005 | Jensen ......................... 341/143 |
| 2006/0098762 | A1 * | 5/2006 | Wojtiuk ....................... 375/308 |
| 2006/0158359 | A1 * | 7/2006 | Magrath ...................... 341/143 |
| 2007/0057720 | A1 * | 3/2007 | Hand et al. .................... 330/10 |

* cited by examiner

*Primary Examiner*—Marlon T Fletcher
(74) *Attorney, Agent, or Firm*—Muncy, Geissler, Olds & Lowe PLLC (57) ABSTRACT

An audio player using sigma-delta pulse-width modulation includes a Δ-Σ PWM unit, a drive unit, a speaker unit, and an error prediction unit. The Δ-Σ PWM unit receives an input signal and generates a pulse-width modulation (PWM) signal by means of sigma-delta pulse-width modulation. The drive unit receives the PWM signal and generates a drive signal, and the speaker unit receives the drive signal to produce sound. The error prediction unit receives the PWM signal and generates a predicted feedback signal for the Δ-Σ PWM unit according to stored error data.

7 Claims, 11 Drawing Sheets

| y[n] \ pulse width | error correction value at y = 1 | error correction value at y = -1 |
|---|---|---|
| 1 | AUDP_E_D[1] | AUDN_E_D[1] |
| 2 | AUDP_E_D[2] | AUDN_E_D[2] |
| 3 | AUDP_E_D[3] | AUDN_E_D[3] |
| 4 | AUDP_E_D[4] | AUDN_E_D[4] |
| ... | ... | ... |
| N | AUDP_E_D[N] | AUDN_E_D[N] |

AUDIO PLAYER USING SIGMA-DELTA PULSE-WIDTH MODULATION

BACKGROUND OF THE INVENTION (a) Field of the Invention

The present invention relates to an audio player that uses a sigma-delta pulse-width modulation (Δ-Σ PWM) architecture and, more particularly, to a Δ-Σ PWM audio player having a considerably reduced signal error.

(b) Description of the Related Art

Figure 1:
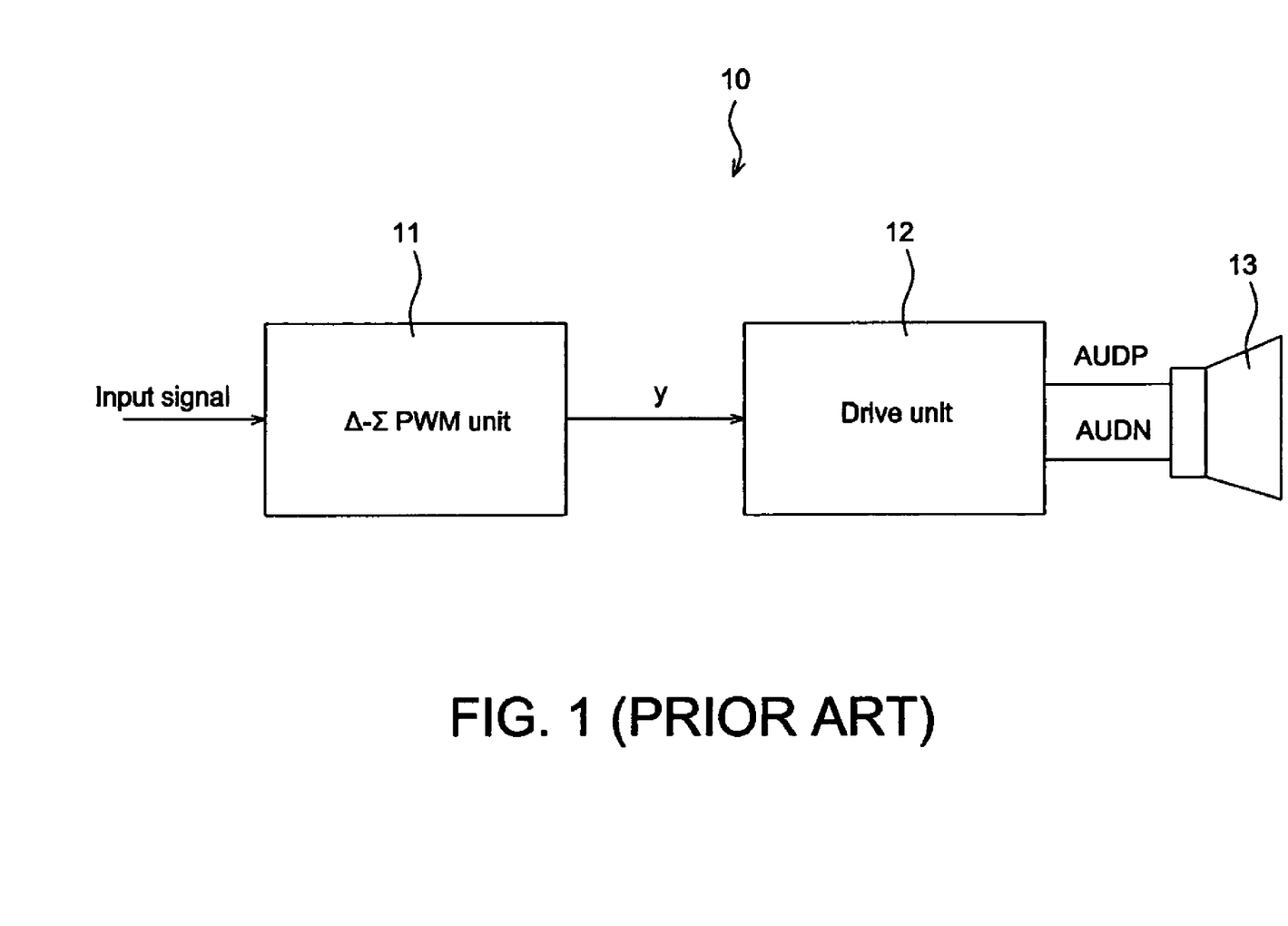
FIG. 1 shows a schematic view illustrating a conventional audio player that uses a Δ-Σ PWM architecture.

FIG. 1 shows a schematic view illustrating a conventional audio player 10 that uses a sigma-delta pulse-width modulation (Δ-Σ PWM) architecture. A typical Δ-Σ PWM audio player includes a Δ-Σ PWM unit 11, a drive unit 12, and a speaker unit 13. The Δ-Σ PWM unit 11 receives input signal and generates a PWM signal y, which is a data sequence consisting of values 1, 0, and −1. The drive unit 12 receives the PWM signal y and generates analog output signals AUDP and AUDN to drive the speaker unit 13.

Figure 2:
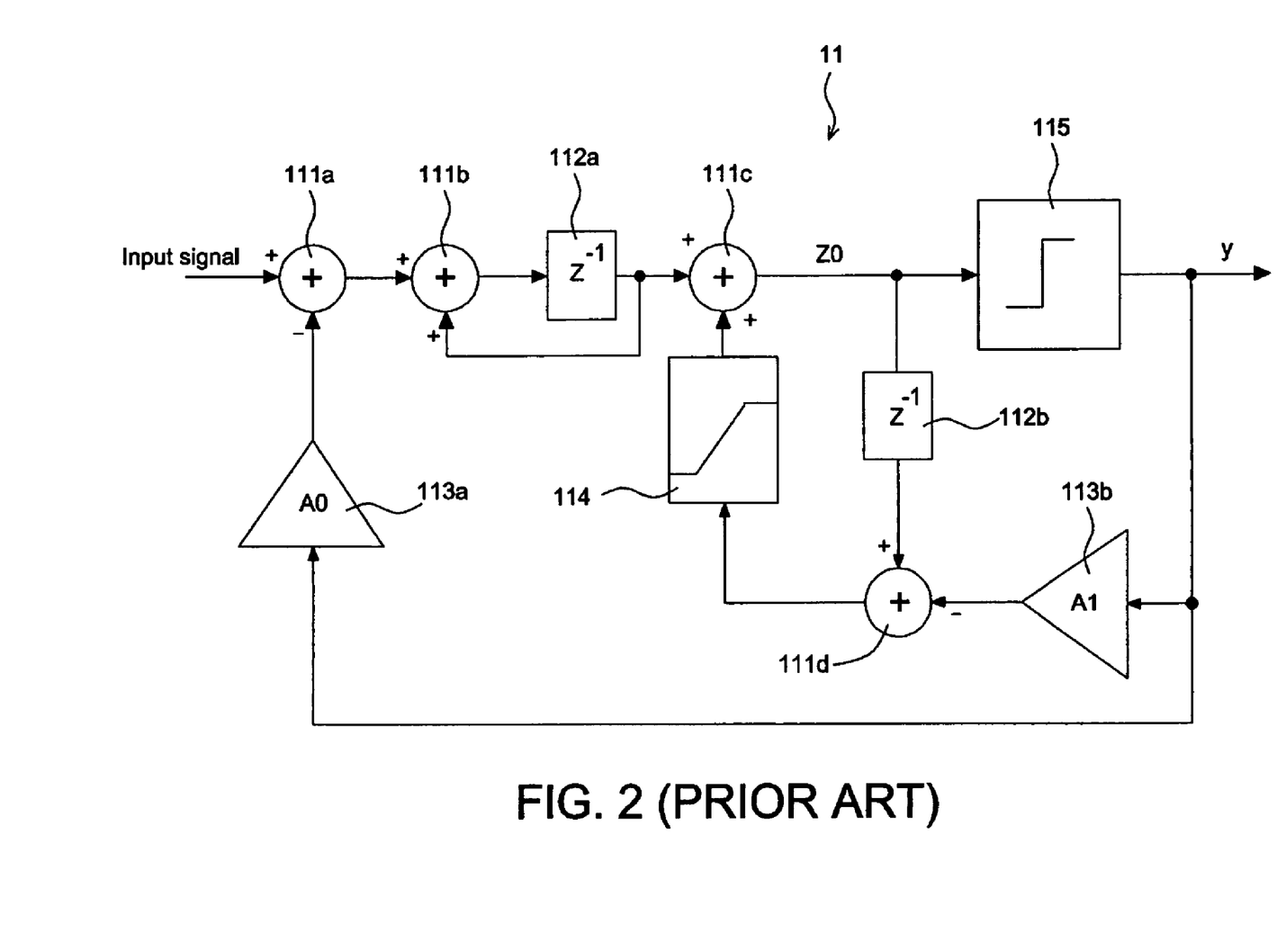
FIG. 2 illustrates a circuit architecture for a conventional Δ-Σ PWM unit.

FIG. 2 illustrates a circuit architecture for the Δ-Σ PWM unit 11. The Δ-Σ PWM unit 11 is used to generate a PWM signal y according to an input signal, where the PWM signal is a feedback signal that serves for adjusting the sound quality of the audio player 10. The Δ-Σ PWM unit 11 includes four adders 111a, 111b, 111c and 111d, two delay units 112a and 112b, two amplifiers 113a and 113b, a limiter 114, and a quantizer 115. The quantizer 115 receives an output signal Z0 of the adder 111c. If the signal Z0 is larger than a certain threshold C0, the PWM signal y is set as 1; if the signal Z0 is smaller than a negative threshold −C0, the PWM signal y is set as −1; Otherwise, the PWM signal y is set as 0.

Referring to FIG. 2, the amplifiers 113a and 113b of the Δ-Σ PWM unit 11 receives the PWM signal y from the quantizer 115 as a feedback signal. Hence, the value of the feedback signal for the Δ-Σ PWM unit 11 is the ideal output value, namely 1, 0 or −1. However, in real condition, the value of the feedback signal is not the ideal 1, 0 or −1, because an actual feedback signal must contain some distortion or error contributed by the drive unit 12 under different loadings. Hence, compared to theoretical values, the signal noise ratio (SNR) and total harmonic distortion (THD) in real condition are not good because the feedback signal must contain some distortion or error that varies with actual loading.

Figure 3:
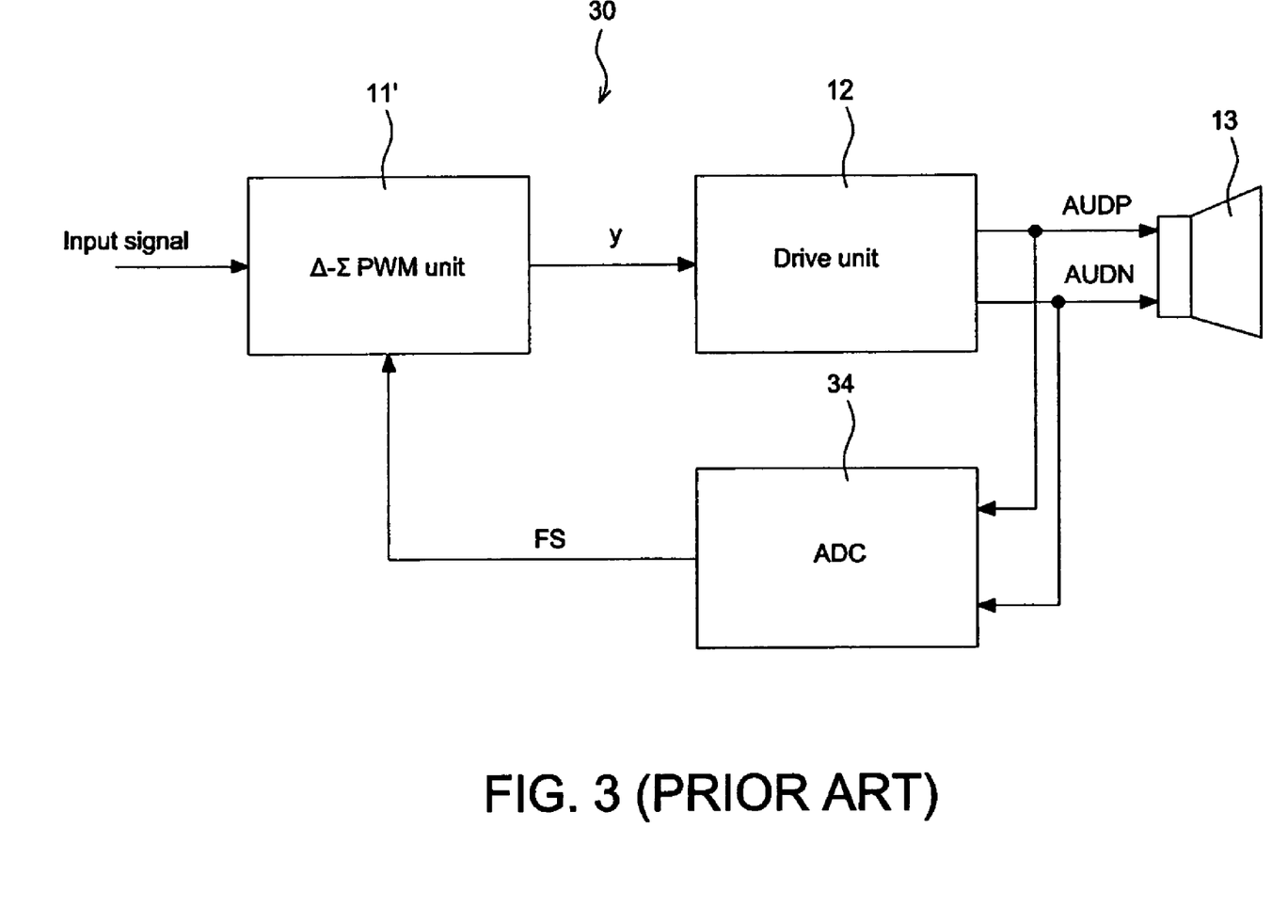
FIG. 3 illustrates a conventional Δ-Σ PWM audio player that uses an analog to digital converter (ADC) to generate a feedback signal.

FIG. 3 illustrates a Δ-Σ PWM audio player that uses an analog to digital converter (ADC) to generate a feedback signal, and, by means of this architecture, the error that varies with actual loading for the feedback signal is taken into account. Referring to FIG. 3, the Δ-Σ PWM audio player 30 includes a Δ-Σ PWM unit 11', a drive unit 12, a speaker unit 13, and further an ADC 34. The ADC 34 is used to convert the output signals AUDP and AUDN of the drive unit 12 into digital signals that serve as the feedback signal of the Δ-Σ PWM unit 11'. Thereby, the feedback signal for the Δ-Σ PWM unit 11' is the actual output signals of the drive unit 12 rather than the ideal PWM signal y, so that the Δ-Σ PWM audio player 30 may eliminate the error of the output signals of the drive unit 12.

Figure 4:
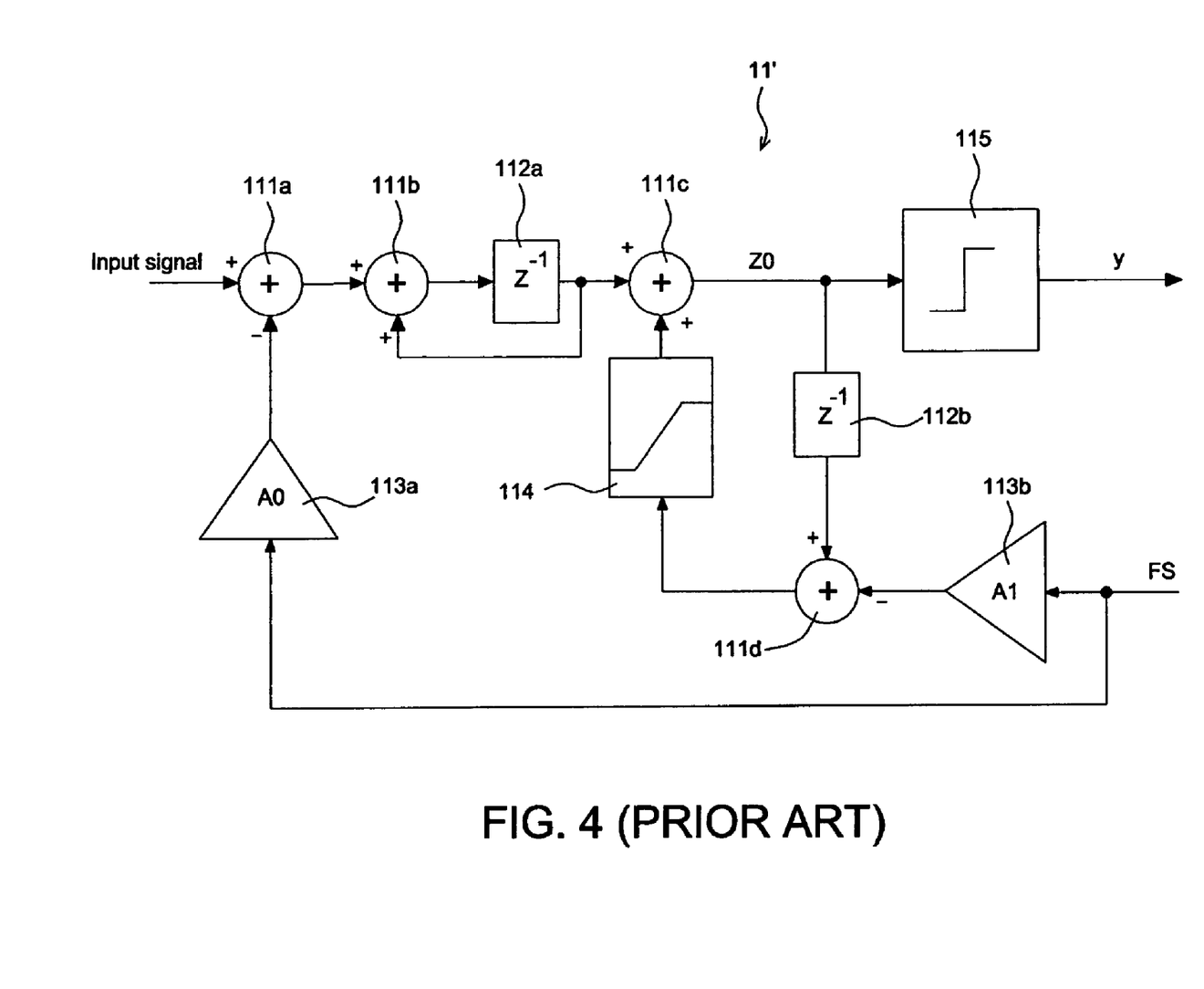
FIG. 4 illustrates a circuit architecture of another conventional Δ-Σ PWM unit.

FIG. 4 illustrates a circuit architecture of the Δ-Σ PWM unit 11'. The components of the Δ-Σ PWM unit 11' are the same as those of the Δ-Σ PWM unit 11, except the amplifiers 113a and 113b of the Δ-Σ PWM unit 11' receive actual output signals FS generated from the ADC 34 as the feedback signal.

However, the high resolution of a typical Δ-Σ PWM unit causes the ADC to have the same requirement of high resolution (16-bit or above), and the high resolution ADC is expensive to result in a considerable cost. On the other hand, a typical Δ-Σ PWM unit tends to suffer considerable noises and has a high processing speed, and thus the ADC must be designed to have adequate capability of anti-noise and have a high procession speed. This may result in a high degree of design difficulty for the overall circuit.

As described above, due to the considerable cost and design difficulty, it is less practical to eliminate the error of the output signals by means of the ADC.

BRIEF SUMMARY OF THE INVENTION

Hence, an object of the invention is to provide an audio player using sigma-delta pulse-width modulation (Δ-Σ PWM) in which a lookup table or a state machine is used to generate error signals to eliminate the signal error due to the actual loading of the drive unit.

According to the invention, an audio player using sigma-delta pulse-width modulation includes a Δ-Σ PWM unit, a drive unit, a speaker unit, and an error prediction unit. The Δ-Σ PWM unit receives an input signal and generates a pulse-width modulation (PWM) signal by means of sigma-delta pulse-width modulation. The drive unit receives the PWM signal and generates a drive signal, and the speaker unit receives the drive signal to produce sound. The error prediction unit receives the PWM signal and generates a predicted feedback signal according to stored error data, wherein the Δ-Σ PWM unit receives the predicted feedback signal as a feedback signal.

Through the design of the invention, the signal error can be eliminated under different loadings of the drive unit to improve sound quality.

DETAILED DESCRIPTION OF THE INVENTION

The audio player using sigma-delta pulse-width modulation according to the invention will be described with reference to the accompanying drawings.

Figure 5:
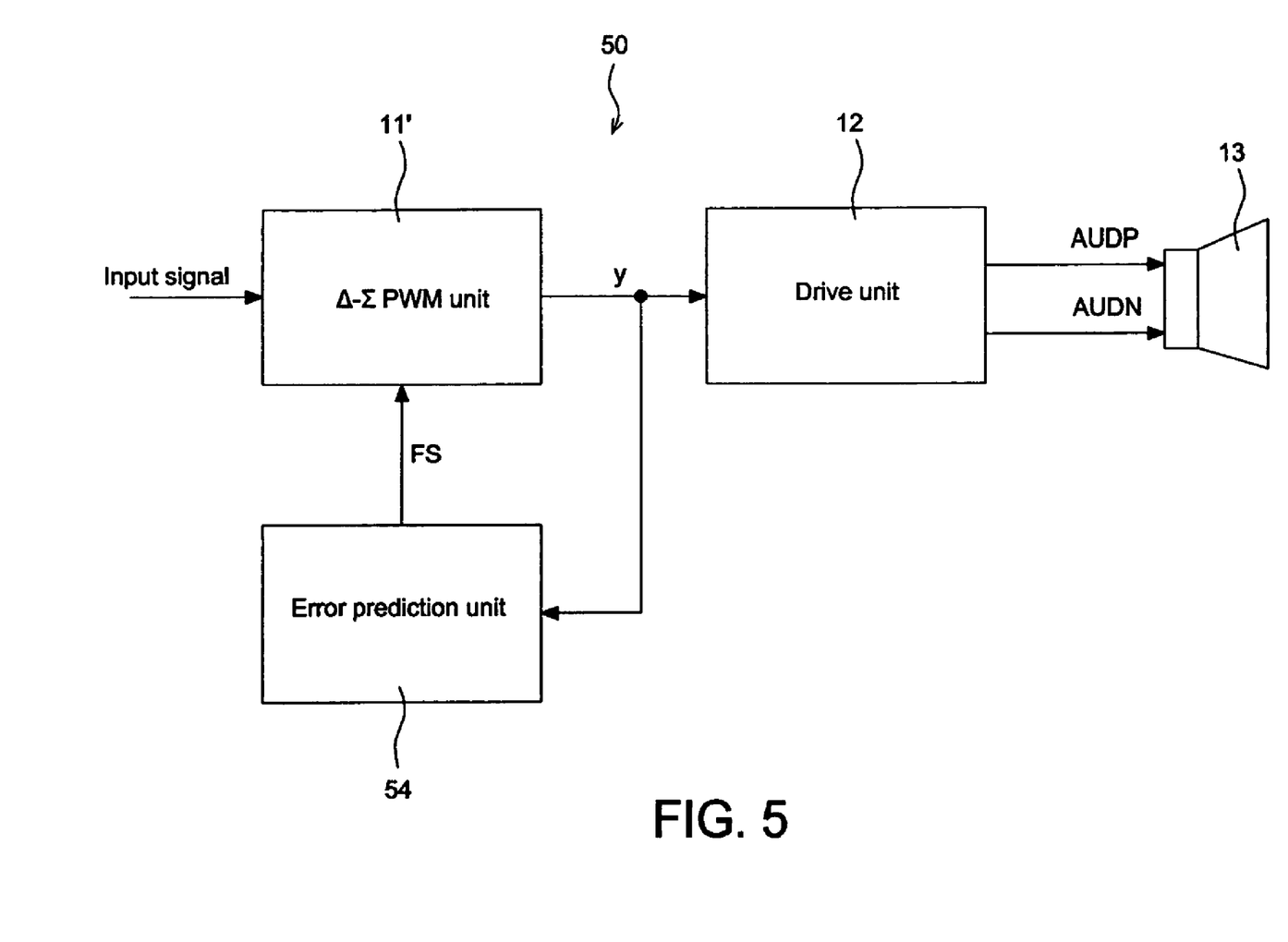
FIG. 5 shows a block diagram illustrating an audio player using a Δ-Σ PWM architecture according to the invention.

FIG. 5 shows a block diagram illustrating an audio player using the sigma-delta pulse-width modulation (Δ-Σ PWM) architecture. Referring to FIG. 5, the Δ-Σ PWM audio player 50 includes a Δ-Σ PWM unit 11', a drive unit 12, a speaker unit 13, and an error prediction unit 54. The Δ-Σ PWM unit 11', the drive unit 12, and the speaker unit 13 are identical with those of the conventional audio player 30 shown in FIG. 3, thus not explaining in detail. Further, the error prediction unit 54 is used to receive the PWM signal y of the Δ-Σ PWM unit 11' and generate a predicted feedback signal FS according to a lookup table that stores data in advance or a state machine that already sets output values.

Figure 6:
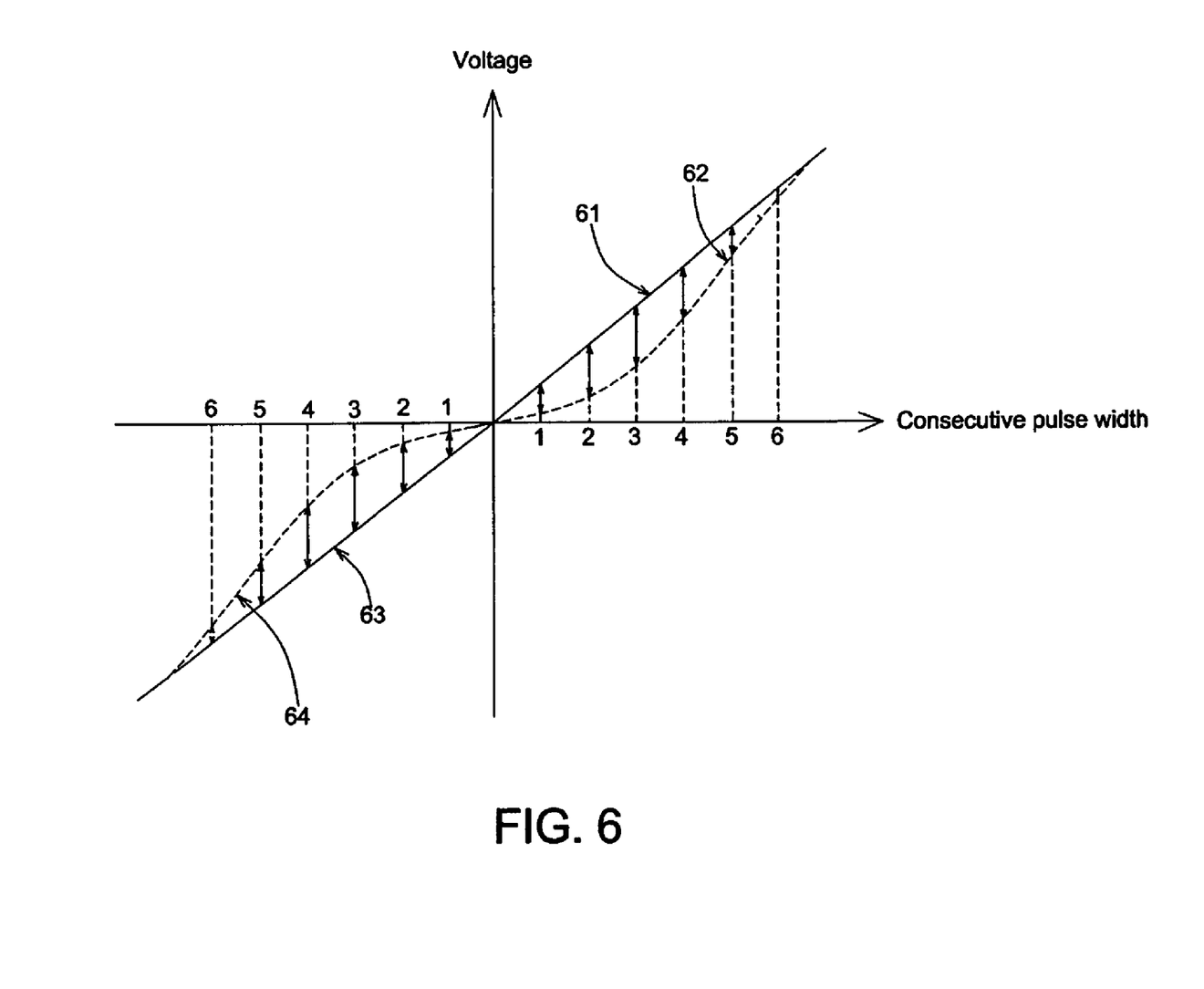
FIG. 6 illustrates the relation between the expected ideal voltages and the actually measured voltages of signals AUDP and AUDN.

FIG. 6 illustrates the relation between the expected ideal voltages and the actually measured voltages of signals AUDP and AUDN, where the horizontal axis shows the number of consecutive same level pulse width of PWM signal and the vertical axis shows the voltage. Referring to FIG. 6, the solid lines 61 and 63 respectively indicate the ideal voltage curves of signals AUDP and AUDN, while the dash lines 62 and 64 respectively indicate the actual voltage curves of signals AUDP and AUDN.

The error AUDP_E[I] defined as the difference between the ideal voltage AUDP_I[I] and the actual voltage AUDP_M[I] of the signal AUDP for each pulse width is:

$$AUDP\_E[I]=AUDP\_I[I]-AUDP\_M[I] \quad (1)$$

Further, the error AUDN_E[I] defined as the difference between the ideal voltage AUDN_I[I] and the actual voltage AUDN_M[I] of the signal AUDN for each pulse width is:

$$AUDN\_E[I]=AUDN\_I[I]-AUDN\_M[I] \quad (2)$$

After standardization, the standardized errors are:

$$AUDP\_E\_S[I]=AUDP\_E[I]/AUDP\_I[I] \quad (3)$$

$$AUDN\_E\_S[I]=AUDN\_E[I]/AUDN\_I[I] \quad (4)$$

Figure 7:
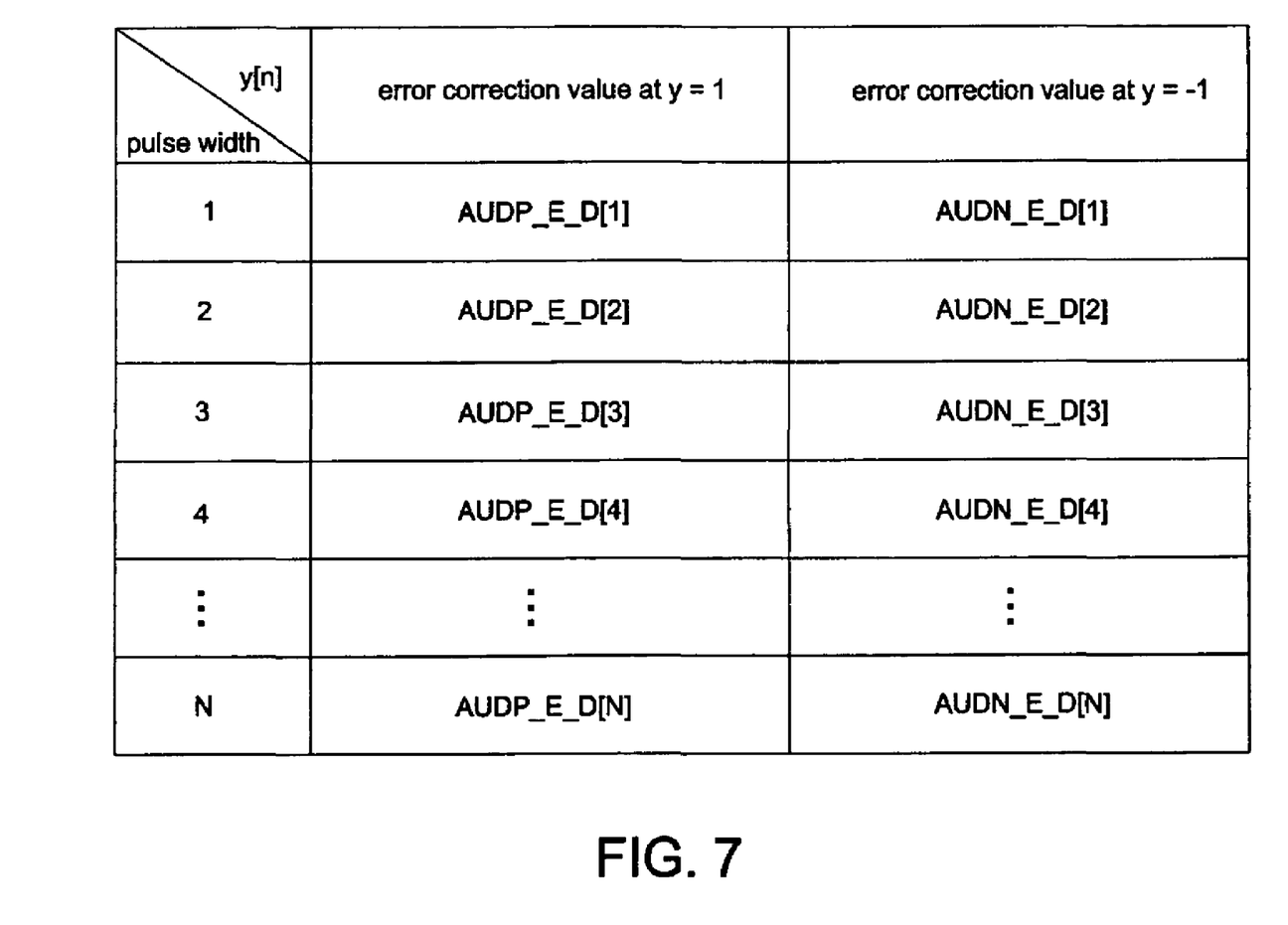
FIG. 7 shows calculated error correction values for a lookup table according to the invention.

Then, the error differences between different numbers of pulse widths are calculated and serve as error correction values for the lookup table. The error correction values for each pulse width are:

$$AUDP\_E\_D[I]=AUDP\_E\_S[I]-AUDP\_E\_S[I-1] \quad (5)$$

$$AUDN\_E\_D[I]=AUDN\_E\_S[I]-AUDN\_E\_S[I-1] \quad (6)$$

wherein, AUDP_E_S[0]=0 and AUDN_E_S[0]=0. The calculated error correction values for the lookup table are shown in FIG. 7.

Figure 8:
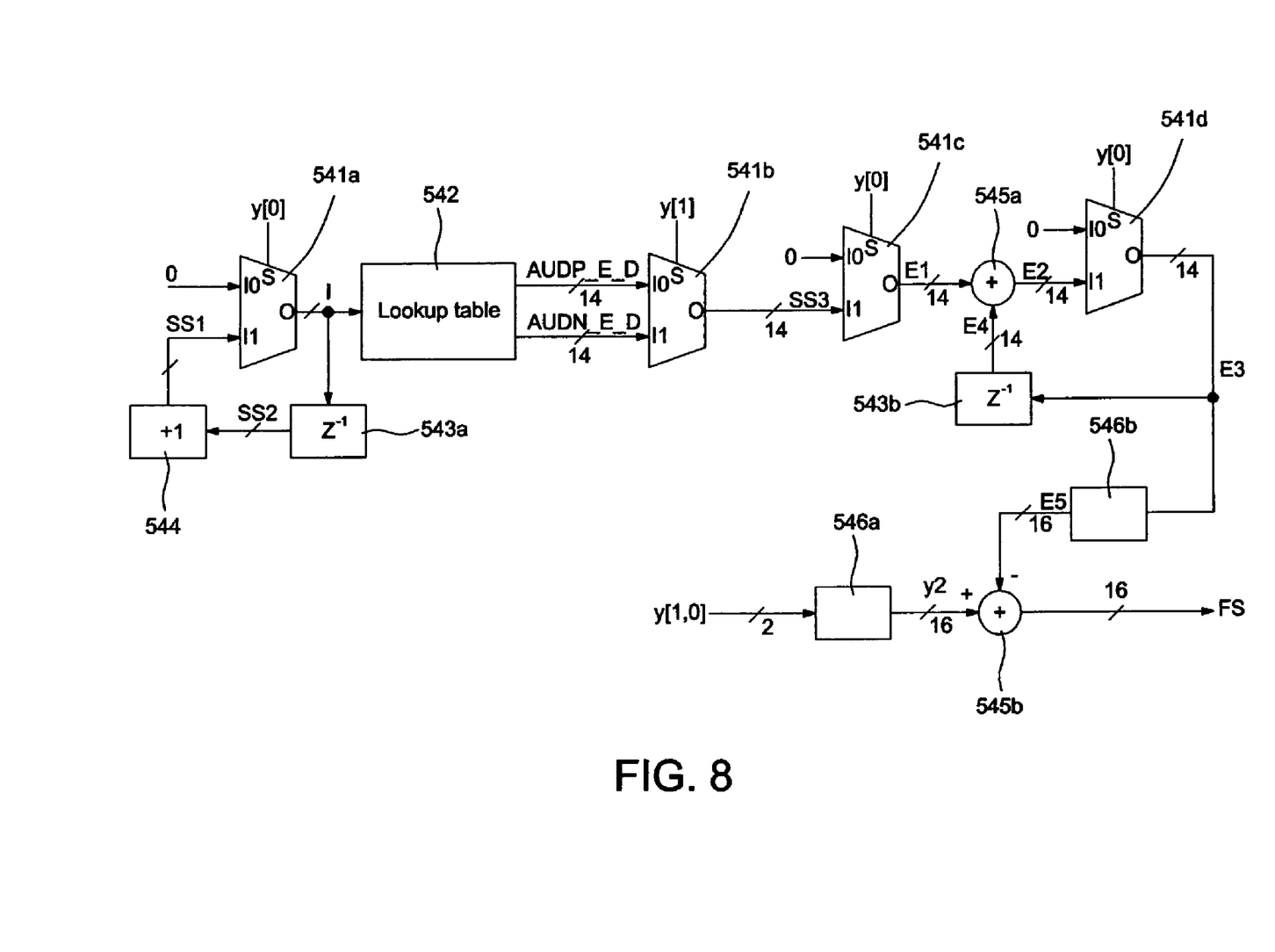
FIG. 8 illustrates an embodiment of an error prediction unit according to the invention.

FIG. 8 illustrates an embodiment of the error prediction unit according to the invention. Referring to FIG. 8, the error prediction unit 54 includes four multiplexers 541a, 541b, 541c and 541d, an error calculation lookup table 542, two delay units 543a and 543b, an accumulator 544, two adders 545a and 545b, and two multiplier 546a and 546b. The error prediction unit 54 receives a sequence data of the PWM signal y and outputs a predicted feedback signal FS, where the values of the PWM signal y, namely 1, 0, or −1, are respectively expressed as binary data format [01], [00], or [11]. In FIG. 8, the notation y[0] indicates the bit 0 of PWM signal y, and the notation y[1] indicates the bit 1 of PWM signal y.

After receiving value 0 and/or the output signal SS1 of the accumulator 544, the multiplexer 541a selects one of them as the consecutive pulse width I according to the PWM signal y[0]. Specifically, the multiplexer 541a outputs value 0 as the PWM signal y[0] is 0; while the multiplexer 541a outputs signal SS1 as the PWM signal y[0] is 1. The delay unit 543a receives the consecutive pulse width I, retards the consecutive pulse width I with one pulse duration, and then outputs a signal SS2. The accumulator 544 receives the signal SS2 from the delay unit 543a and adds the signal SS2 by one unit to output the signal SS1. The error calculation lookup table 542 receives the pulse width I and outputs error correction values AUDP_E_D and AUDN_E_D according to the pulse width I. The multiplexer 541b receives the error correction values AUDP_E_D and AUDN_E_D and selects one of them as an output signal SS3 according to the PWM signal y[1]. Specifically, the multiplexer 541b outputs value AUDP_E_D as the PWM signal y[1] is 0; while the multiplexer 541b outputs value AUDN_E_D as the PWM signal y[1] is 1.

After receiving value 0 and the output signal SS3 of the multiplexer 541b, the multiplexer 541c selects one of them as an error signal E1 according to the PWM signal y[0]. Specifically, the multiplexer 541c outputs value 0 as the PWM signal y[0] is 0; while the multiplexer 541c outputs signal SS3 as the PWM signal y[0] is 1. The adder 545a sums up the output signal E1 of the multiplexer 541c and the output signal E4 of the delay unit 543b to output a signal E2.

After receiving value 0 and the output signal E2 of the adder 545a, the multiplexer 541d selects one of them as an error signal E3 according to the PWM signal y[0]. Specifically, the multiplexer 541d outputs value 0 as the PWM signal y[0] is 0; while the multiplexer 541d outputs the signal E2 as the PWM signal y[0] is 1. The delay unit 543b receives the error signal E3 and delays it with one pulse duration to output a signal E4.

Then, in case the bit number of the data in the error calculation lookup table 542 is less than that of the predicted feedback signal FS, a multiplier 546b may be used to make them have identical bit numbers. For example, in one embodiment the data in the error calculation lookup table 542 are 14-bit and the predicted feedback signal FS is 16-bit, so the error signal E3 is multiplied by 4 to generate data E5. Similarly, since the PWM signal is 2-bit, the multiplier 546a may change the 2-bit signal into a 16-bit data y2. Finally, the error prediction unit 54 subtracts the data E5 from the data y2 to generate the predicted feedback signal FS by means of the adder 545b.

For example, the data in the error calculation lookup table 542 are listed as the following:

$$AUDP\_E\_D[1]=0.008$$

$$AUDP\_E\_D[2]=-0.002$$

$$AUDP\_E\_D[3]=-0.0005$$

. . .

$$AUDN\_E\_D[1]=-0.008$$

$$AUDN\_E\_D[2]=0.002$$

$$AUDN\_E\_D[3]=0.0005$$

. . .

1. When the PWM signal y consists of one pulse width having level 1, the predicted feedback signal FS=y+AUDP_E_D[1=1.008.

2. When the PWM signal y consists of two consecutive pulse widths having level 1, the predicted feedback signal FS=y+AUDP_E_D[1]+AUDP_E_D[2]=1.006.

3. When the PWM signal y consists of three consecutive pulse widths having level 1, the predicted feedback signal FS=y+AUDP_E_D[1]+AUDP_ED[2]+AUDP_E_D[3=1.0055.

4. When the PWM signal y consists of one pulse width having level −1, the predicted feedback signal FS=y+AUDN_E_D[1]=−1.008.

5. When the PWM signal y consists of two consecutive pulse widths having level −1, the predicted feedback signal FS=y+AUDN_E_D[1]+AUDN_E_D[2]=−1.006.

6. When the PWM signal y consists of three consecutive pulse widths having level −1, the predicted feedback signal FS=y+AUDN_E_D[1]+AUDN_E_D[2]y+AUDN_E_D[3]=−1.0055.

Figure 9:
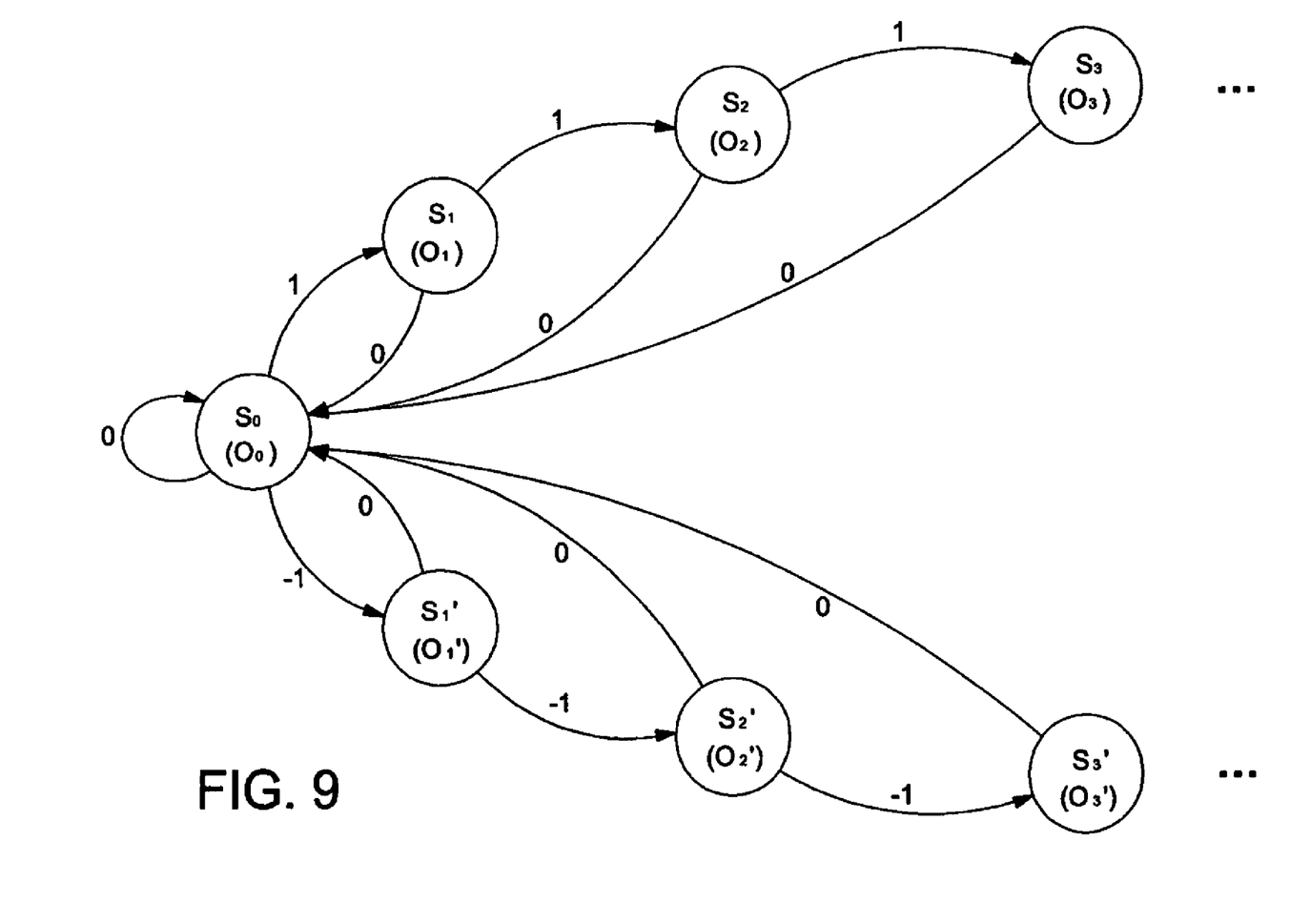
FIG. 9 shows a state diagram illustrating the state transition of predicted feedback signals under the use of a finite state machine.

FIG. 9 shows a state diagram illustrating the state transition of the predicted feedback signal under the use of a finite state machine (FSM), where the output of each state is the predicted feedback signal. Referring to FIG. 9, the state diagram is divided into two branches, with one branch regarding the PWM signal y having value 1 and the other regarding the PWM signal y having value −1. From FIG. 9, it can be clearly seen that any state will jump back to the state $S_0$ when the PWM signal y equals 0. The output $O_0$ of the state $S_0$ is 0; that is, the predicted feedback signal FS of the state $S_0$ is 0. The operations of the state machine are described below.

1. The state transition of the PWM signal y having value 1:

When the PWM signal is changed from 0 to 1, the state of the FSM is changed from the state $S_0$ to the state $S_1$, and thus the output of the FSM is $O_1$. Thereafter, the PWM signal y still remains 1, and the state of the FSM is sequentially changed from the state $S_1$ to the state $S_2$, state $S_3$ ... until the PWM signal y becomes 0 and the state of the FSM jumps back to the sate $S_0$.

2. The state transition of the PWM signal y having value −1:

When the PWM signal is changed from 0 to −1, the state of the FSM is changed from the state $S_0$ to a state $S_1'$, and thus the output of the FSM is $O_1'$. Thereafter, the PWM signal y still remains −1, and the state of the FSM is sequentially changed from state $S_1'$ to the state $S_2'$, state $S_3'$ ... until the PWM signal y becomes 0 and the state of the FSM jumps back to the sate $S_0$.

Accordingly, the corresponding predicted feedback signal FS is quickly generated only by finding out a proper output values $O_1, O_2, O_3, O_4 \ldots O_N$ in advance. For example, when the data in the error calculation table 542 are:

AUDP_E_D[1]=0.008

AUDP_E_D[2]=−0.002

AUDP_E_D[3]=−0.0005

...

AUDN_E_D[1]=−0.008

AUDN_E_D[2]=0.002

AUDN_E_D[3]=0.0005

...

the respective outputs of the FSM are:

$O_1$=1.008
$O_2$=1.006
$O_3$=1.0055
$O_1'$=−1.008
$O_2'$=−1.006
$O_3'$=−1.0055

Hence, only as the data in the error calculation table 542 or the output values of the FSM are preset in advance according to actual loadings, actual predicted feedback signal can be generated quickly to eliminate or at least lower the signal error.

Figure 10:
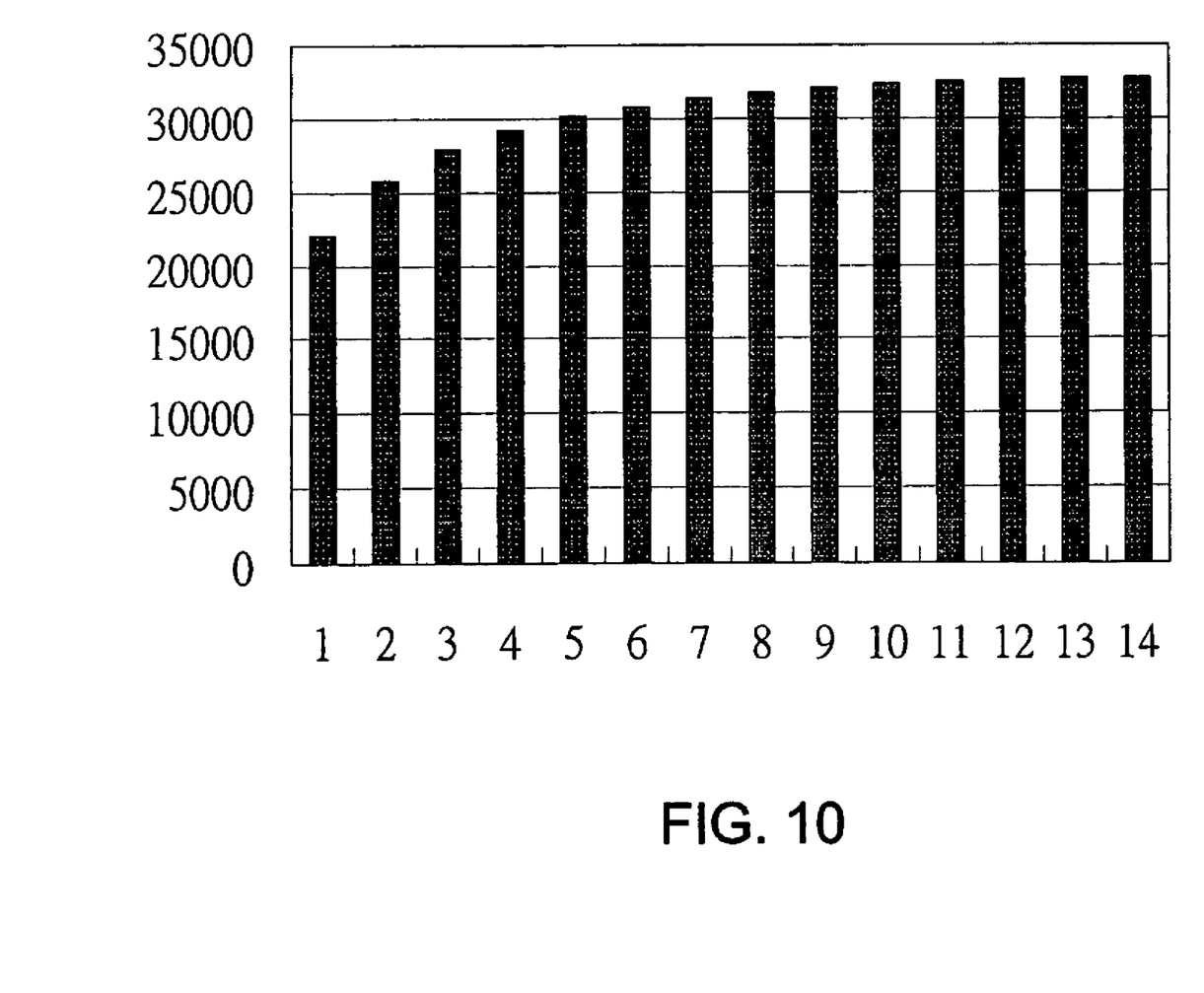
FIG. 10 shows a static diagram presenting the input data range with respect to the Δ-Σ PWM pulse width.

FIG. 10 shows a static diagram presenting the input data range with respect to the Δ-Σ PWM pulse width, where the horizontal axis shows the number of the consecutive Δ-Σ PWM pulse width I, and the vertical axis shows the absolute value of the input data range (ranged from +32768 to −32768). According to the calculated result:

1. when the input data range (absolute value)<22000, the number of the consecutive Δ-Σ PWM pulse width for the signal y is ≦1;

2. when the input data range (absolute value)<25500, the number of the consecutive Δ-Σ PWM pulse widths for the signal y is ≦2;

3. when the input data range (absolute value)<27500, the number of the consecutive Δ-Σ PWM pulse widths for the signal y is ≦3;

4. when the input data range (absolute value)<29500, the number of the consecutive Δ-Σ PWM pulse widths for the signal y is ≦4.

Figure 11:
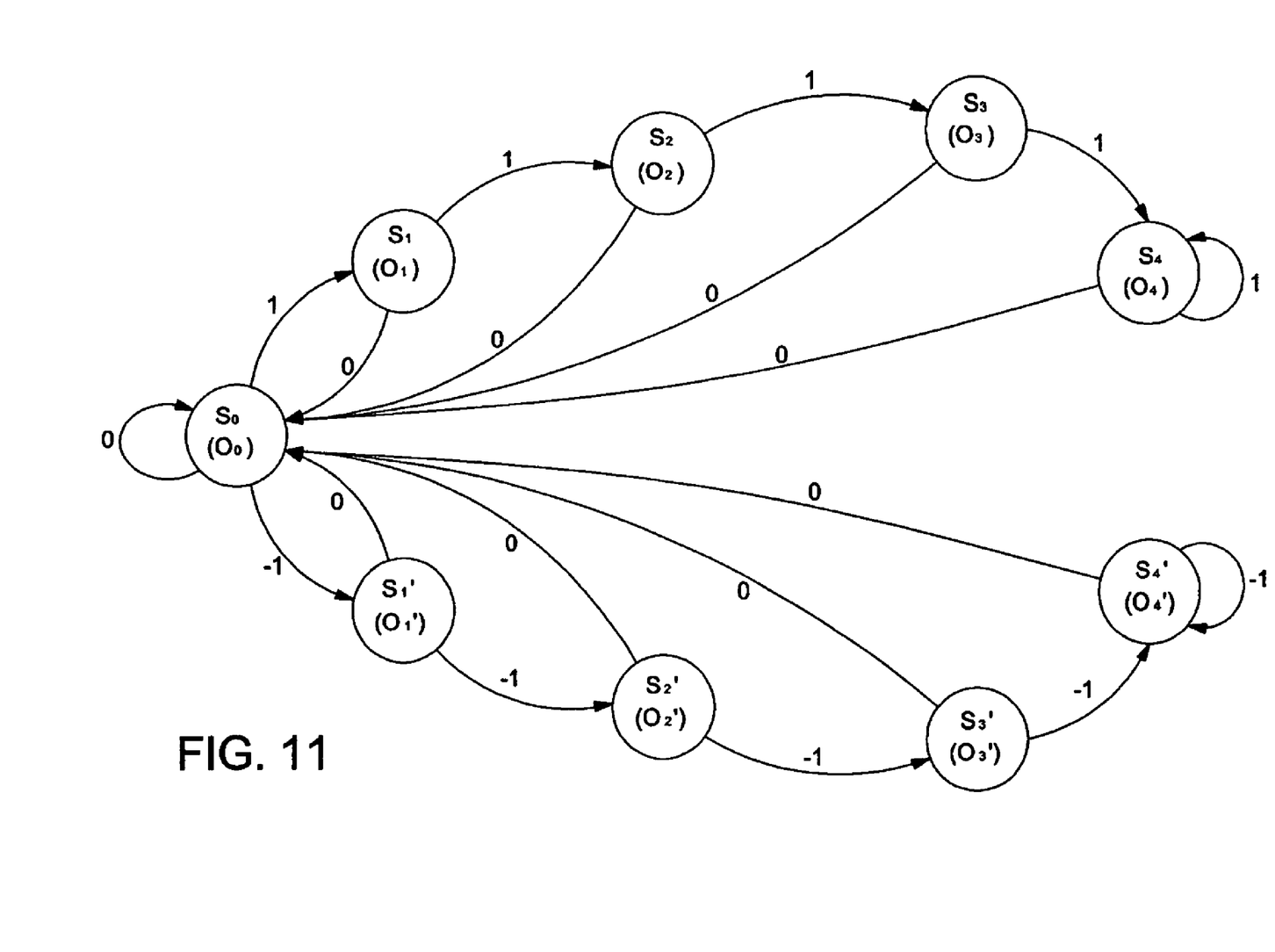
FIG. 11 shows a state diagram illustrating the state transition of predicted feedback signals where only the condition no more than three consecutive pulse widths are exhibited.

The above calculated result means the data range to be corrected for the Δ-Σ PWM audio player is between +29500 and −29500, approximating 90% of overall input data range, even if only fours sets of parameters AUDN_E_D[I] and AUDN_E_D[I] (corresponding to the numbers of the consecutive Δ-Σ PWM pulse widths I1, 2, 3 and 4) are stored in the lookup table 542. Further, in order to obtain a more complete data range, fifteen sets of parameters AUDN_E_D[I] and AUDN_E_D[I] (corresponding to the numbers of the consecutive Δ-Σ PWM pulse widths I=1-15) may also be stored in the lookup table 542. Similarly, for the use of the finite state machine 90, it is acceptable to set only part states that jump to an identical state, having output of ideal voltages of parameters AUDN_E_D[I] and AUDN_E_D[I], when the number of the pulse widths exceeds a preset value. For example, FIG. 11 shows a state diagram where only the condition no more than three consecutive pulse widths are taken into account, and the state of the finite state machine jump to a state $S_4$ ($S_4'$) with output $O_4$ ($O_4'$) having value 1 (−1) when the number of the pulse widths exceeds three.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An audio player using sigma-delta pulse-width modulation (Δ-Σ PWM), comprising:

a Δ-Σ PWM unit for receiving an input signal and generating a pulse-width modulation (PWM) signal by means of sigma-delta pulse-width modulation;

a drive unit for receiving the PWM signal and generating a drive signal;

a speaker unit for receiving the drive signal to produce sound; and an error prediction unit connected to an output of said Δ-Σ PWM unit for receiving the PWM signal and outputting one of stored error data as a predicted feedback signal according to the pulse-width with same level of the received PWM signal;

wherein the Δ-Σ PWM unit receives the predicted feedback signal as a feedback signal.

2. The audio player as claimed in claim 1, wherein the value of the PWM signal is 1, 0, or −1.

3. The audio player as claimed in claim 2, wherein the error prediction unit is a finite state machine, and the finite state machine generates a preset output as the predicted feedback signal according to the PWM signal.

4. The audio player as claimed in claim 3, wherein the states of the finite state machine comprising:
state $S_0$, wherein the state of the finite state machine jumps to the state $S_0$ as the PWM signal is 0 and the value 0 is output as the predicted feedback signal, and the state of the finite state machine jumps to a state $S_1$ as the PWM signal is changed to 1 and jumps to the a state $S_1'$ as the PWM signal is changed to −1;
state $S_1$, wherein a value $O_1$ is output as the predicted feedback signal, and the state of the finite state machine jumps to a state $S_2$ as the PWM signal remains the value 1 and jumps to the state $S_0$ as the PWM signal is changed to 0;
state $S_2$, wherein a value $O_2$ is output as the predicted feedback signal, and the state of the finite state machine jumps to a state $S_3$ as the PWM signal remains the value 1 and jumps to the state $S_0$ as the PWM signal is changed to 0;
state $S_3$, wherein a value $O_3$ is output as the predicted feedback signal, and the state of the finite state machine jumps to a state $S_4$ as the PWM signal remains the value 1 and jumps to the state $S_0$ as the PWM signal is changed to 0;
state $S_4$, wherein the value 1 is output as the predicted feedback signal, and the state of the finite state machine remains the state $S_4$ as the PWM signal remains the value 1 and jumps to the state $S_0$ as the PWM signal is changed to 0;
state $S_1'$, wherein a value $O_1'$ is output as the predicted feedback signal, and the state of the finite state machine jumps to a state $S_2'$ as the PWM signal remains the value −1 and jumps to the state $S_0$ as the PWM signal is changed to 0;
state $S_2'$, wherein a value $O_2'$ is output as the predicted feedback signal, and the state of the finite state machine jumps to a state $S_3'$ as the PWM signal remains the value −1 and jumps to the state $S_0$ as the PWM signal is changed to 0;
state $S_3'$, wherein a value $O_3'$ is output as the predicted feedback signal, and the state of the finite state machine jumps to a state $S_4'$ as the PWM signal remains the value −1 and jumps to the state $S_0$ as the PWM signal is changed to 0; and
state $S_4'$, wherein the value −1 is output as the predicted feedback signal, and the state of the finite state machine remains the state $S_4'$ as the PWM signal remains the value −1 and jumps to the state $S_0$ as the PWM signal is changed to 0.

5. The audio player as claimed in claim 2, wherein the error prediction unit comprises:
a first multiplexer for receiving a value 0 and an accumulation signal, and selecting one of them as a pulse width signal according to the lowest bit of the PWM signal;
a first delay unit for receiving the pulse width signal and retarding the pulse width signal with one pulse duration to output a fist delay signal;
an accumulator for receiving the first delay signal and adding the first delay signal by one unit to output the accumulation signal;
an error calculation look up table for storing a positive error signal and a negative error signal related to each pulse width and outputting the error signals according to the pulse width signal;
a second multiplexer for receiving the positive and negative error signals and selecting one of them as a first error signal according to the highest bit of the PWM signal;
a third multiplexer for receiving a value 0 and the first error signal and selecting one of them as a second error signal according to the lowest bit of the PWM signal;
a first adder for summing up the second error signal and a second delay signal to output a third error signal;
a fourth multiplexer for receiving a value 0 and the third error signal and selecting one of them as a present error signal according to the lowest bit of the PWM signal;
a second delay unit for receiving the present error signal and retarding the present error signal with one pulse duration to output the second delay signal; and
a second adder for summing up the present error signal and the PWM signal to output the predicted feedback signal.

6. The audio player as claimed in claim 5, wherein the error prediction unit further comprises:
a first multiplier provided between the second adder and the fourth multiplexer for adjusting the bit number of the present error signal; and
a second multiplier for receiving the PWM signal and adjusting the bit number of the PWM signal.

7. The audio player as claimed in claim 3, wherein the states of the finite state machine comprising:
state $S_0$, wherein the state of the finite state machine jumps to the state $S_0$ as the PWM signal is 0 and the value 0 is output as the predicted feedback signal, and the state of the finite state machine jumps to a state $S_1$ as the PWM signal is changed to 1 and jumps to a state $S_1'$ as the PWM signal is changed to −1;
state $S_1$, wherein a value $O_1$ is output as the predicted feedback signal, and the state of the finite state machine jumps to a next state $S_{N-1}$ as the PWM signal remains the value 1 and jumps to the state $S_0$ as the PWM signal is changed to 0;
state $S_{N-1}$, wherein a value $O_{N-1}$ is output as the predicted feedback signal, and the state of the finite state machine jumps to a state $S_N$ as the PWM signal remains the value 1 and jumps to the state $S_0$ as the PWM signal is changed to 0;
state $S_N$, wherein the value 1 is output as the predicted feedback signal, and the state of the finite state machine remains the state $S_N$ as the PWM signal remains the value 1 and jumps to the state $S_0$ as the PWM signal is changed to 0;
state $S_1'$, wherein a value $O_1'$ is output as the predicted feedback signal, and the state of the finite state machine jumps to a next state $S_{N-1}'$ as the PWM signal remains the value −1 and jumps to the state $S_0$ as the PWM signal is changed to 0;
state $S_{N-1}'$, wherein a value $O_1'$ is output as the predicted feedback signal, and the state of the finite state machine jumps to a state $S_N'$ as the PWM signal remains the value −1 and jumps to the state $S_0$ as the PWM signal is changed to 0; and
state $S_N'$, wherein the value −1 is output as the predicted feedback signal, and the state of the finite state machine remains the state $S_N'$ as the PWM signal remains the value −1 and jumps to the state $S_0$ as the PWM signal is changed to 0.

* * * * *